(12) United States Patent
Nishihara (10) Patent No.: US 12,506,064 B2
(45) Date of Patent: Dec. 23, 2025

(54) SEMICONDUCTOR DEVICE

(71) Applicant: SHINKO ELECTRIC INDUSTRIES CO., LTD., Nagano-ken (JP)

(72) Inventor: Yoichi Nishihara, Nagano (JP)

(73) Assignee: SHINKO ELECTRIC INDUSTRIES CO., LTD, Nagano-ken (JP)

( * ) Notice: Subject to any disclaimer, the term of this patent is extended or adjusted under 35 U.S.C. 154(b) by 386 days.

(21) Appl. No.: 18/333,951

(22) Filed: Jun. 13, 2023

(65) Prior Publication Data

US 2023/0411274 A1 Dec. 21, 2023

(30) Foreign Application Priority Data

Jun. 17, 2022 (JP) ................................ 2022-098185

(51) Int. Cl.
| | |
|---|---|
| H01L 23/48 | (2006.01) |
| H01L 23/00 | (2006.01) |
| H01L 23/31 | (2006.01) |
| H01L 23/498 | (2006.01) |

(52) U.S. Cl.
CPC .... H01L 23/49844 (2013.01); H01L 23/3121 (2013.01); H01L 24/32 (2013.01); *H01L 2224/32227* (2013.01); *H01L 2224/32235* (2013.01)

(58) Field of Classification Search
None
See application file for complete search history.

(56) References Cited

U.S. PATENT DOCUMENTS

| | | | | |
|---|---|---|---|---|
| 5,471,089 A | * | 11/1995 | Nagatomo | ............... H01L 24/06 |
| | | | | 257/E23.079 |
| 2015/0223339 A1 | * | 8/2015 | Nakamura | ........... H05K 7/2089 |
| | | | | 361/779 |
| 2021/0249344 A1 | * | 8/2021 | Kusano | ............... H01L 23/5386 |
| 2023/0282562 A1 | * | 9/2023 | Hoang | .............. H01L 23/49844 |
| | | | | 257/690 |

FOREIGN PATENT DOCUMENTS

JP 2018120902 A 8/2018

* cited by examiner

*Primary Examiner* — Nicholas J Tobergte
(74) *Attorney, Agent, or Firm* — Tarolli, Sunheim, Covell & Tummino LLP (57) ABSTRACT

A semiconductor device includes a lower substrate, a first wiring pattern disposed on the lower substrate with a current input terminal, a semiconductor element mounted on the lower substrate with a first electrode electrically connected to the first wiring pattern and a second electrode opposed to the first wiring pattern, an upper substrate disposed on the second electrode, via wirings extending through the upper substrate and connected to the second electrode, a second wiring pattern disposed on the upper substrate and electrically connected to the second electrode via the via wirings, and a current output terminal. The second wiring pattern is electrically connected to the current output terminal and extends from the second electrode toward the current output terminal in plan view. Among the via wirings, first via wirings closest to the current output terminal are larger than second via wirings adjacent to the first via wirings in plan view.

10 Claims, 9 Drawing Sheets

Fig.6 (Comparative Example)

SEMICONDUCTOR DEVICE

CROSS-REFERENCE TO RELATED APPLICATIONS

This application is based upon and claims the benefit of priority from prior Japanese Patent Application No. 2022-098185, filed on Jun. 17, 2022, the entire contents of which are incorporated herein by reference.

FIELD

This disclosure relates to a semiconductor device.

BACKGROUND

A power semiconductor device (power module) is a known semiconductor device that controls and supplies power. This type of semiconductor device may include a lower substrate, an upper substrate, a semiconductor element mounted between the lower substrate and the upper substrate, an encapsulation resin disposed between the lower substrate and the upper substrate to encapsulate the semiconductor element, and a wiring layer formed on an upper surface of the upper substrate. The wiring layer formed on the upper surface of the upper substrate is electrically connected to an electrode of the semiconductor element by multiple via wirings that extend through the upper substrate in a thickness-wise direction. Japanese Laid-Open Patent Publication No. 2018-120902 discloses the structure of such a semiconductor device.

SUMMARY

In a conventional semiconductor device, when a current flows to the semiconductor element, the current density may be increased in (concentrated on) some of the via wirings. The increased current density may generate heat in the via wiring and locally break the via wiring. The local breakage of the via wiring decreases the reliability of electrical connection of the wiring layer with the electrode of the semiconductor element.

An embodiment of a semiconductor device includes a lower substrate, a first wiring pattern disposed on an upper surface of the lower substrate and including a current input terminal to which a current is input, a semiconductor element mounted on the upper surface of the lower substrate and including a first electrode electrically connected to the first wiring pattern and a second electrode, the first electrode and the second electrode being disposed at opposite sides of the semiconductor element, an upper substrate disposed on the second electrode of the semiconductor element, multiple via wirings extending through the upper substrate in a thickness-wise direction and connected to the second electrode, a second wiring pattern disposed on an upper surface of the upper substrate and electrically connected to the second electrode via the multiple via wirings, and a current output terminal that outputs the current. The second wiring pattern is electrically connected to the current output terminal and extends in a first direction from the second electrode toward the current output terminal in plan view. The multiple via wirings include one or more first via wirings disposed closest to the current output terminal in the first direction, and one or more second via wirings disposed adjacent to the one or more first via wirings in the first direction. Each of the one or more first via wirings is greater than each of the one or more second via wirings in size in plan view.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

An embodiment will now be described with reference to the accompanying drawings.

Elements in the drawings may be partially enlarged for simplicity and clarity and thus have not necessarily been drawn to scale. To facilitate understanding, hatching lines may not be illustrated or be replaced by shadings in the cross-sectional drawings. The drawings include an x-axis, a y-axis, and a z-axis that are orthogonal to each other. In the description hereafter, for the sake of convenience, a direction extending along the x-axis is referred to as the x-axis direction, a direction extending along the y-axis is referred to as the y-axis direction, and a direction extending along the z-axis is referred to as the z-axis direction. In this specification, "plan view" refers to a view of an object taken in the z-axis direction, and "planar shape" refers to a shape of an object viewed in the z-axis direction.

General Structure of Semiconductor Device 10

The general structure of a semiconductor device 10 will now be described with reference to FIGS. 1 to 4.

The semiconductor device 10 illustrated in FIGS. 1 to 4 is, for example, a power semiconductor device (power module) that controls and supplies power. The semiconductor device 10 may be, for example, a DC-DC converter.

The semiconductor device 10 includes a lower substrate 20, at least one (in the example illustrated in FIG. 1, one) semiconductor element 30 mounted on an upper surface of the lower substrate 20, and an upper substrate 40 disposed on an upper surface of the semiconductor element 30. The semiconductor device 10 includes a wiring layer 21 disposed on the upper surface of the lower substrate 20.

Figure 3:
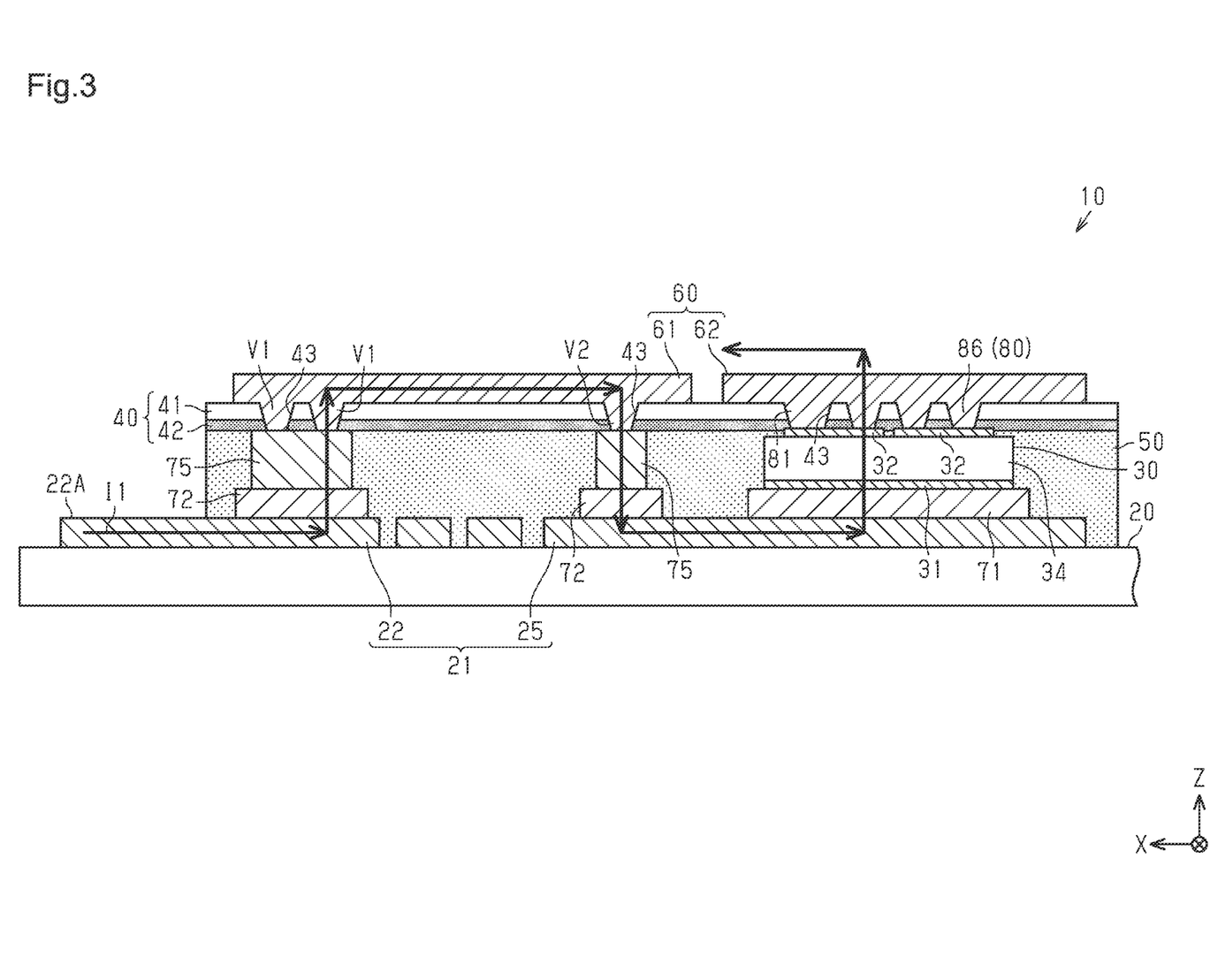
FIG. 3 is a schematic cross-sectional view of the semiconductor device taken along line 3-3 illustrated in FIG. 1.
Figure 4:
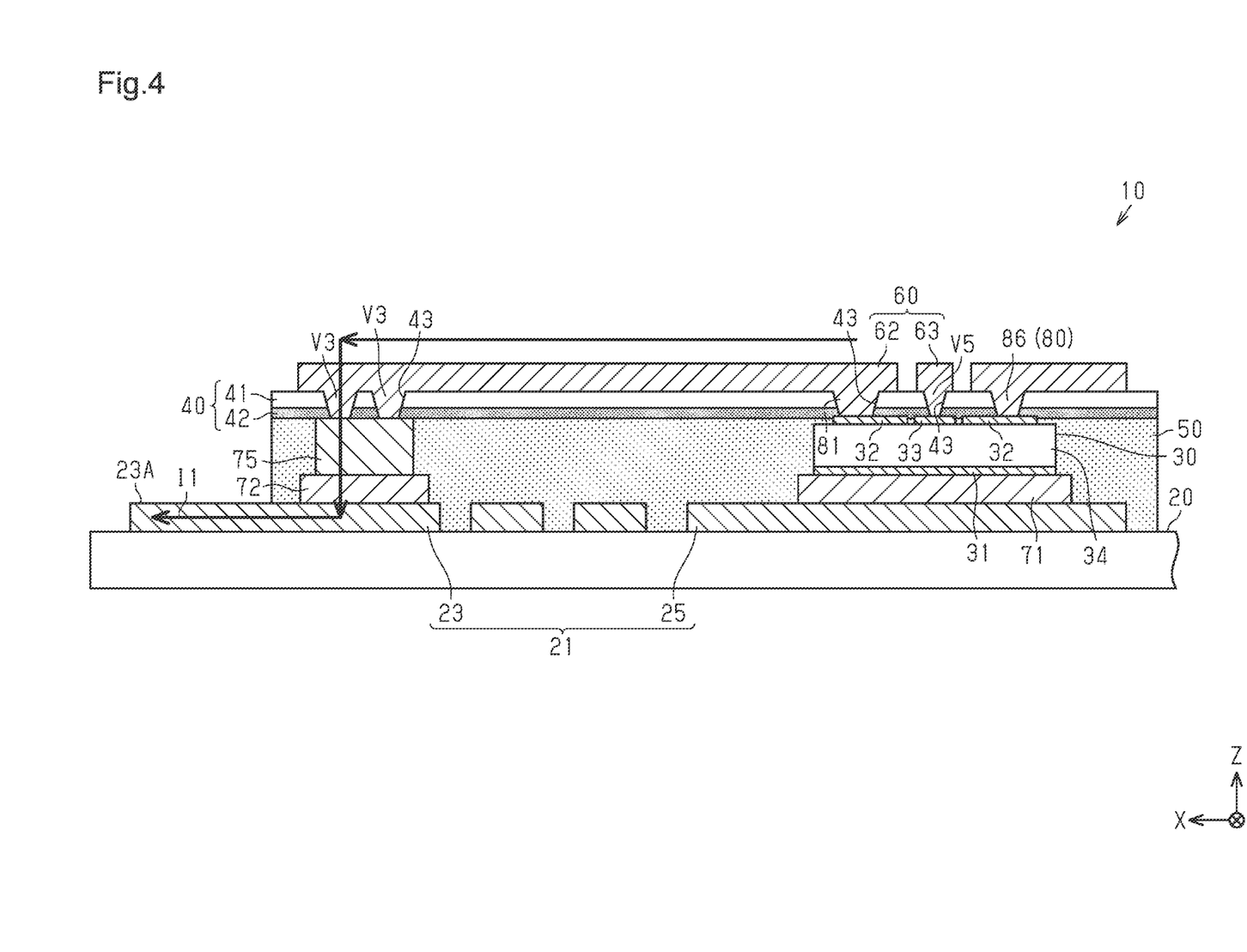
FIG. 4 is a schematic cross-sectional view of the semiconductor device taken along line 4-4 illustrated in FIG. 1.

As illustrated in FIGS. 3 and 4, the semiconductor device 10 includes an encapsulation resin 50, which is disposed between the lower substrate 20 and the upper substrate 40 to encapsulate the semiconductor element 30, and a wiring layer 60, which is disposed on the upper surface of the upper substrate 40 and electrically connected to the semiconductor element 30. The semiconductor element 30 is disposed between the upper surface of the lower substrate 20 and the lower surface of the upper substrate 40. The semiconductor device 10 incorporates the semiconductor element 30 between the lower substrate 20 and the upper substrate 40.

Structure of Semiconductor Element 30

The semiconductor element 30 is formed from, for example, silicon (Si) or silicon carbide (SiC). The semiconductor element 30 is, for example, a semiconductor element for power electronics, that is, a power semiconductor element. Examples of the semiconductor element 30 include an insulated gate bipolar transistor (IGBT), a metal-oxide-semiconductor field-effect transistor (MOSFET), and a diode. In the present embodiment, the semiconductor element 30 is a MOSFET. The semiconductor element 30 may have any planar shape and any size in plan view. For example, the planar shape of the semiconductor element 30 is rectangular. The size of the semiconductor element 30 in plan view may be, for example, approximately 5 mm×5 mm. The thickness of the semiconductor element 30 may be, for example, in a range from 50 μm to 600 μm.

As illustrated in FIG. 4, the semiconductor element 30 includes, for example, an electrode 31, disposed on the lower surface of the semiconductor element 30, and electrodes 32 and 33, disposed on the upper surface of the semiconductor element 30. The semiconductor element 30 includes, for example, a body portion 34. The electrodes 32 and 33 are opposite to the electrode 31. The electrode 31 is, for example, a drain electrode of the MOSFET. The electrode 32 is, for example, a source electrode of a MOSFET. The electrode 33 is, for example, a gate electrode of a MOSFET.

The material of the electrodes 31, 32, and 33 may be, for example, a metal such as aluminum (Al) or copper (Cu) or an alloy including at least one selected from these metals. A surface-processed layer may be formed on surfaces of the electrodes 31, 32, and 33 where appropriate. Examples of the surface-processed layer include a gold (Au) layer, a nickel (Ni) layer/Au layer (metal layer in which the Ni layer is used as bottom layer, and the Au layer is formed on the Ni layer), and an Ni layer/palladium (Pd) layer/Au layer (metal layer in which the Ni layer is used as bottom layer, and the Ni layer, the Pd layer, and the Au layer are sequentially stacked). Each of the Au layer, the Ni layer, and the Pd layer may be, for example, an electroless plated metal layer formed through an electroless plating process. The Au layer is a metal layer formed with Au or an Au alloy. The Ni layer is a metal layer formed with Ni or a Ni alloy. The Pd layer is a metal layer formed with Pd or a Pd alloy.

The electrode 31 is formed on, for example, the lower surface of the body portion 34. For example, the electrode 31 covers the entire lower surface of the body portion 34.

Figure 2:
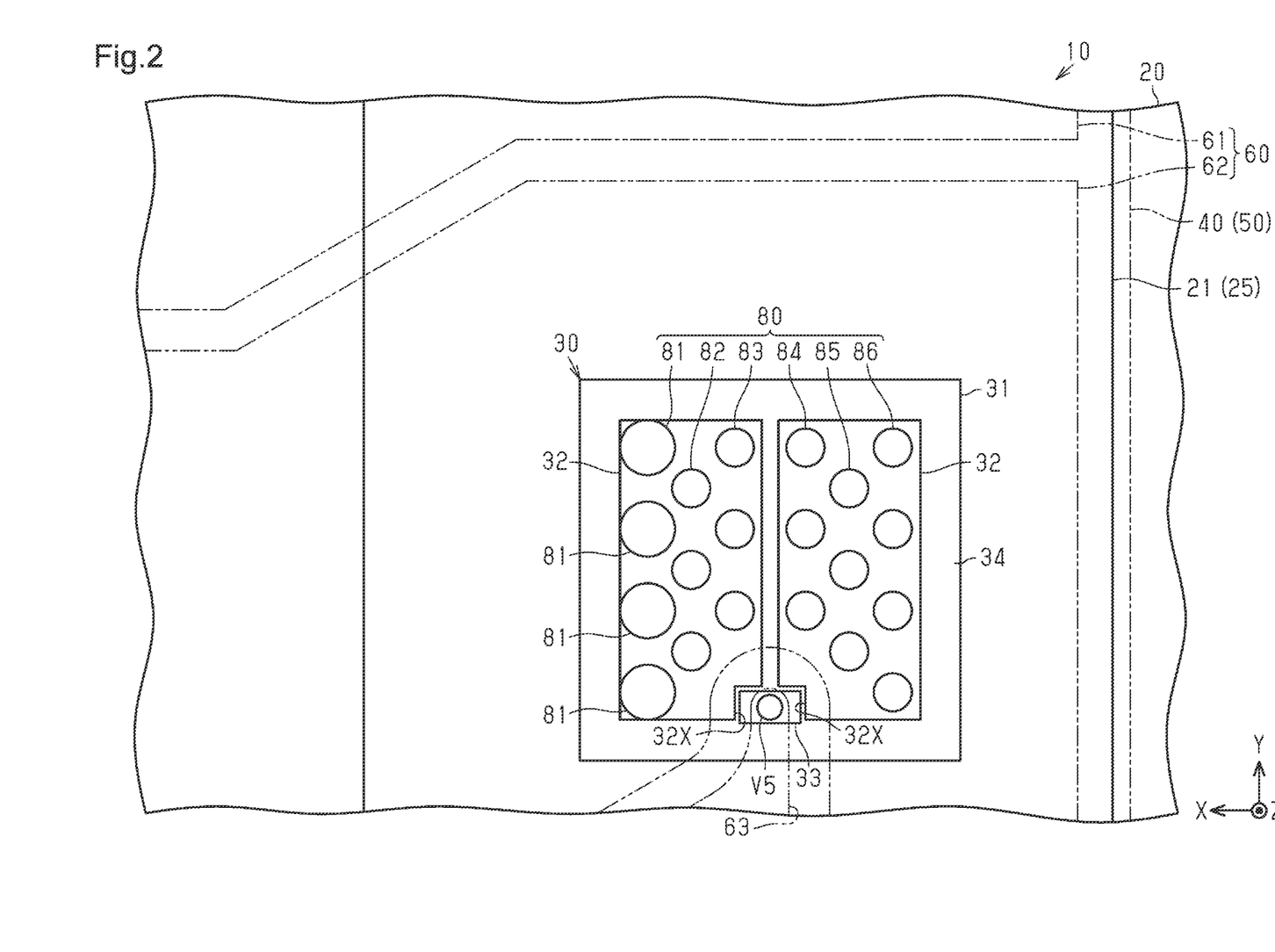
FIG. 2 is an enlarged partial plan view of the semiconductor device illustrated in FIG. 1.

As illustrated in FIG. 2, for example, the electrodes 32 and 33 are formed on the upper surface of the body portion 34. In the present embodiment, for example, two electrodes 32 and one electrode 33 are disposed on the upper surface of the body portion 34. The two electrodes 32 are spaced apart from each other and disposed on the upper surface of the body portion 34. The two electrodes 32 are, for example, arranged next to each other in the x-axis direction. Each electrode 32 includes, for example, a recess 32X formed by cutting away a portion (lower portion in FIG. 2) of the electrode 32. For example, the electrode 33 is disposed on the upper surface of the body portion 34 at a position separated from the electrode 32. For example, the electrode 33 is disposed in the two recesses 32X in plan view.

Structure of Lower Substrate 20

Figure 1:
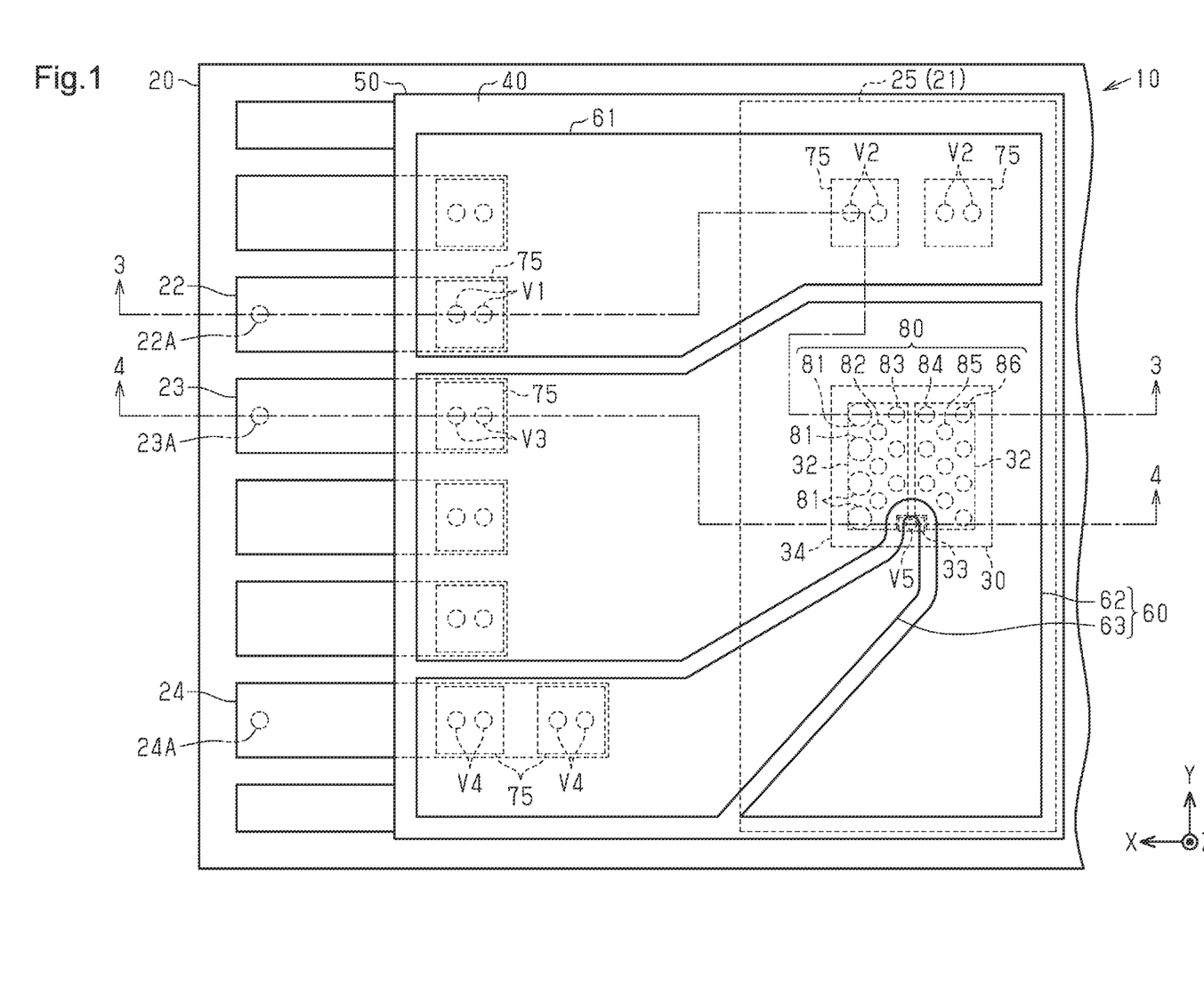
FIG. 1 is a schematic plan view illustrating an embodiment of a semiconductor device.

As illustrated in FIG. 1, the lower substrate 20 is flat. The lower substrate 20 is, for example, a ceramic substrate formed of a ceramic such as oxide-based ceramic or non-oxide-based ceramic. Examples of oxide ceramic are aluminum oxide ($Al_2O_3$) and zirconia ($ZrO_2$). Examples of non-oxide ceramic are aluminum nitride (AlN) and silicon nitride ($Si_3N_4$).

The lower substrate 20 may have any planar shape and any size in plan view. For example, the planar shape of the lower substrate 20 is rectangular. The thickness of the lower substrate 20 may be, for example, in a range from 200 μm to 400 μm. FIG. 1 is a plan view of the semiconductor device 10, which is illustrated in FIGS. 3 and 4, as viewed from above. FIG. 2 is an enlarged partial plan view of the semiconductor device 10 illustrated in FIG. 1. In FIG. 2, the upper substrate 40, the encapsulation resin 50, and the wiring layer 60 are illustrated transparently.

Structure of Wiring Layer 21

As illustrated in FIG. 1, the wiring layer 21 includes, for example, multiple wiring patterns. In the example illustrated in FIG. 1, the wiring layer 21 includes wiring patterns 22, 23, 24, and 25.

The material of the wiring patterns 22, 23, 24, and 25 may be, for example, copper or a copper alloy. A surface-processed layer may be formed on surfaces (upper and side surfaces or only upper surface) of the wiring patterns 22, 23, 24, and 25 where appropriate. The surface-processed layer may be a metal layer such as an Au layer, an Ni layer/Au layer, or an Ni layer/Pd layer/Au layer. The thickness of each of the wiring patterns 22, 23, 24, and 25 may be, for example, in a range from 100 μm to 800 μm.

The wiring patterns 22, 23, 24, and 25 are spaced apart from each other and disposed on the upper surface of the lower substrate 20. Each of the wiring patterns 22, 23, 24, and 25 may have any planar shape and any size in plan view.

The planar shape of the wiring pattern 22 is, for example, rectangular. In an example, the wiring pattern 22 has a given width in the y-axis direction, which is a planar direction, and is elongated in the x-axis direction, which is another planar direction orthogonal to the y-axis direction. In an example, a portion of the wiring pattern 22 overlaps the upper substrate 40 in plan view, and the remaining portion of the wiring pattern 22 is exposed from the upper substrate 40. As illustrated in FIG. 3, in an example, the wiring pattern 22 is electrically connected to the electrode 31 of the semiconductor element 30. In other words, the wiring pattern 22 is electrically connected to the electrode 31 serving as the drain electrode.

In an example, the wiring pattern 22 includes a current input terminal 22A. The current input terminal 22A may be a portion of the wiring pattern 22. In an example, the wiring pattern 22 includes a portion exposed from the upper substrate 40 and the encapsulation resin 50, and the upper surface of the exposed portion is defined as the current input terminal 22A. The current input terminal 22A is, for example, electrically connected to an external electrode arranged outside the semiconductor device 10 or the like. The current input terminal 22A is, for example, a connection terminal to which current I1 is input from a circuit, a power supply, or the like arranged outside the semiconductor device 10. In the present embodiment, the current input terminal 22A is a drain electrode terminal.

As illustrated in FIG. 1, the planar shape of the wiring pattern 23 is, for example, rectangular. In an example, the wiring pattern 23 has a given width in the y-axis direction and is elongated in the x-axis direction. In an example, the wiring pattern 23 is located below the wiring pattern 22 in FIG. 1. In an example, the wiring pattern 23 extends parallel to the wiring pattern 22. In an example, the wiring pattern 23 and the wiring pattern 22 have the same length in the x-axis direction. In an example, a portion of the wiring pattern 23 overlaps the upper substrate 40 in plan view, and the remaining portion of the wiring pattern 23 is exposed from the upper substrate 40. As illustrated in FIG. 4, in an example, the wiring pattern 23 is electrically connected to the electrode 32 of the semiconductor element 30. In other words, the wiring pattern 23 is electrically connected to the electrode 32 serving as the source electrode.

In an example, the wiring pattern 23 includes a current output terminal 23A. The current output terminal 23A may be a portion of the wiring pattern 23. In an example, the wiring pattern 23 includes a portion exposed from the upper substrate 40 and the encapsulation resin 50, and the upper surface of the exposed portion is defined as the current output terminal 23A. The current output terminal 23A is, for example, electrically connected to an external electrode arranged outside the semiconductor device 10 or the like. The current output terminal 23A is, for example, a connection terminal that outputs the current I1 (refer to FIG. 4) to a circuit or the like arranged outside the semiconductor device 10. In the present embodiment, the current output terminal 23A is a source electrode terminal.

The planar shape of the wiring pattern 24 is, for example, rectangular. In an example, the wiring pattern 24 has a given width in the y-axis direction and is elongated in the x-axis direction. In an example, the wiring pattern 24 is located below the wiring pattern 23 in FIG. 1. In an example, the wiring pattern 24 extends parallel to the wiring patterns 22 and 23. In an example, the wiring pattern 24 is longer than the wiring patterns 22 and 23 in the x-axis direction. In an example, a portion of the wiring pattern 24 overlaps the upper substrate 40 in plan view, and the remaining portion of the wiring pattern 24 is exposed from the upper substrate 40. In an example, the wiring pattern 24 is electrically connected to the electrode 33 of the semiconductor element 30. In other words, the wiring pattern 24 is electrically connected to the electrode 33 serving as the gate electrode.

In an example, the wiring pattern 24 includes a connection terminal 24A. The connection terminal 24A is disposed on a portion of the upper surface of the wiring pattern 24 that is exposed from the upper substrate 40 and the encapsulation resin 50. The connection terminal 24A is, for example, electrically connected to an external electrode arranged outside the semiconductor device 10 or the like. In an example, the connection terminal 24A is a gate electrode terminal.

The planar shape of the wiring pattern 25 is, for example, rectangular. In an example, the wiring pattern 25 is formed to be greater than each of the wiring patterns 22, 23, and 24 in size in plan view. In an example, the wiring pattern 25 is formed in a solid manner. In an example, the wiring pattern 25 extends on the entirety of approximately one-half (right half in FIG. 1) of the upper surface of the lower substrate 20. In an example, the wiring pattern 25 entirely overlaps the upper substrate 40 in plan view. In an example, the wiring pattern 25 overlaps the semiconductor elements 30 in plan view. In an example, the wiring pattern 25 is electrically connected to the electrode 31 (refer to FIG. 3) of the semiconductor element 30.

Structure of Bonding Portion 71

As illustrated in FIG. 3, the semiconductor element 30 is bonded to the upper surface of the wiring pattern 25 by a conductive bonding portion 71. That is, the bonding portion 71 bonds the electrode 31 to the wiring pattern 25. Thus, the bonding portion 71 electrically connects the electrode 31 of the semiconductor element 30 to the wiring pattern 25.

As illustrated in FIG. 1, in an example, the semiconductor element 30 entirely overlaps the wiring pattern 25 in plan view. In an example, the semiconductor element 30 entirely overlaps the upper substrate 40 in plan view.

Structure of Bonding Portion 72

As illustrated in FIG. 3, conductive bonding portions 72 are formed on the upper surface of the wiring patterns 22 and 25. In the same manner, as illustrated in FIG. 4, a bonding portion 72 is formed on the upper surface of the wiring pattern 23. Although not illustrated in detail, a bonding portion 72 is also formed on the upper surface of the wiring pattern 24 illustrated in FIG. 1. A connection member 75 is formed on the upper surface of each of the bonding portions 72. Therefore, the wiring pattern 22 (refer to FIG. 3) is bonded and electrically connected to the connection member 75 by the bonding portion 72. The wiring pattern 25 (refer to FIG. 3) is bonded and electrically connected to the connection member 75 by the bonding portion 72. The wiring pattern 23 (refer to FIG. 4) is bonded and electrically connected to the connection member 75 by the bonding portion 72. The wiring pattern 24 (refer to FIG. 1) is bonded and electrically connected to the connection member 75 by the bonding portion 72.

The material of the bonding portions 71 and 72 may be, for example, a metal sintering material. In an example, the sintering material may be a sintering material having silver (Ag) particles as a main component (silver sintering material) or a sintering material having copper particles as a main component (copper sintering material). The material of the bonding portions 71 and 72 may be, for example, solder, a conductive paste such as a silver paste, or a brazing metal. The thickness of each of the bonding portions 71 and 72 may be, for example, in a range from 10 µm to 60 µm.

Structure of Connection Member 75

The connection members 75 are electrically connected to the wiring layer 60, which is formed on the upper surface of the upper substrate 40. Thus, the wiring patterns 22, 23, 24, and 25 are electrically connected to the wiring layer 60 by the bonding portions 72 and the connection members 75. In an example, the connection members 75 are rod-shaped and extend in the stacking direction of the semiconductor device 10 (in the present embodiment, z-axis direction). The connection members 75 are, for example, metal posts. Each connection member 75 and the semiconductor element 30 have, for example, the same thickness. The thickness of the connection member 75 may be, for example, in a range from 50 µm to 775 µm. The material of the connection member 75 may be, for example, copper or a copper alloy.

Structure of Upper Substrate 40

The upper substrate 40 is disposed on a side of the semiconductor element 30 where the electrodes 32 and 33 are located, that is, on the electrodes 32 and 33 of the semiconductor element 30. Thus, the upper substrate 40 is disposed on the upper surface of the semiconductor element 30. The upper substrate 40 is also disposed on the upper surfaces of the connection members 75. The upper substrate 40 is flat. The upper substrate 40 may have any planar shape and any size in plan view. As illustrated in FIG. 1, the planar shape of the upper substrate 40 is, for example, rectangular. The upper substrate 40 is, for example, smaller than the lower substrate 20 in size in plan view. In an example, the dimension of the upper substrate 40 in the x-axis direction is smaller than the dimension of the lower substrate 20 in the x-axis direction. In an example, the dimension of the upper substrate 40 in the y-axis direction is smaller than the dimension of the lower substrate 20 in the y-axis direction. In an example, the entirety of the upper substrate 40 overlaps the lower substrate 20 in plan view.

As illustrated in FIG. 4, the upper substrate 40 includes, for example, a substrate body 41 and an adhesive layer 42 formed on the lower surface of the substrate body 41. The material of the substrate body 41 may be, for example, an insulative resin such as a polyimide resin or a polyester resin. The adhesive layer 42 may be, for example, an epoxy-based, polyimide-based, or silicone-based adhesive. The thickness of the substrate body 41 may be, for example, in a range from 30 µm to 50 µm. The thickness of the adhesive layer 42 may be, for example, in a range from 15 µm to 45 µm.

The substrate body 41 is, for example, adhered to the semiconductor element 30 and the connection members 75 by the adhesive layer 42. The adhesive layer 42 is adhered to the upper surface of the semiconductor element 30 and the lower surface of the substrate body 41. The adhesive layer 42 is adhered to the upper surfaces of the connection members 75 and the lower surface of the substrate body 41. The adhesive layer 42 covers, for example, a portion of the semiconductor element 30. In other words, the portion of the semiconductor element 30 is embedded in the adhesive layer 42. In an example, portions of the electrodes 32 and 33 of the semiconductor element 30 are embedded in the adhesive layer 42.

The upper substrate 40 includes multiple openings 43 extending through the upper substrate 40 in the thickness-wise direction (in the present embodiment, z-axis direction). In an example, the openings 43 extend through the substrate body 41 and the adhesive layer 42 in the thickness-wise direction. As illustrated in FIG. 4, in an example, each opening 43 is tapered to have an opening width (opening diameter) that decreases from the upper side (the upper surface of the upper substrate 40) toward the lower side (the lower surface of the upper substrate 40 faced to the lower substrate 20). In an example, the opening 43 has the form of an inverted truncated cone so that the lower open end has a smaller diameter than the upper open end. For example, some of the openings 43 partially expose the upper surfaces of the electrodes 32 and 33. For example, some of the openings 43 partially expose the upper surfaces of the connection members 75.

Structure of Wiring Layer 60

The wiring layer 60 is formed on the upper surface of the upper substrate 40. As illustrated in FIG. 1, the wiring layer 60 includes wiring patterns 61, 62, and 63. The material of the wiring patterns 61, 62, and 63 may be, for example, copper or a copper alloy. A surface-processed layer may be formed on surfaces (both upper and side surfaces or only upper surface) of the wiring patterns 61, 62, and 63 where appropriate. The surface-processed layer may be a metal layer such as an Au layer, an Ni layer/Au layer, or an Ni layer/Pd layer/Au layer. The thickness of the wiring patterns 61 and 62 may be, for example, in a range from 50 µm to 200 µm.

The wiring patterns 61, 62, and 63 are spaced apart from each other and disposed on the upper surface of the upper substrate 40. The wiring patterns 61, 62, and 63 may have any planar shape and any size in plan view.

Structure of Wiring Pattern 61

In an example, the wiring pattern 61 electrically connects the wiring pattern 22 to the wiring pattern 25. In an example, the wiring pattern 61 extends in the x-axis direction in plan view. In an example, the wiring pattern 61 extends from the wiring pattern 22 to the wiring pattern 25 in plan view.

In an example, the wiring pattern 61 partially overlaps the wiring pattern 22 in plan view. In an example, the wiring pattern 61 overlaps a right end portion of the wiring pattern 22 illustrated in FIG. 1 in plan view. As illustrated in FIG. 3, in an example, one or more (for example, two) via wirings V1 extend through the upper substrate 40 in the thickness-wise direction and electrically connect the wiring pattern 61 to the connection member 75 disposed on the wiring pattern 22. The wiring pattern 61 is electrically connected to the wiring pattern 22 by, for example, the via wirings V1, the connection members 75, and the bonding portion 72. In an example, the wiring pattern 61 is formed integrally with the via wirings V1. In an example, each via wiring V1 is formed in an opening 43 that exposes a portion of the upper surface of the connection member 75 disposed on the wiring pattern 22. In an example, each via wiring V1 fills the opening 43. In an example, two via wirings V1 are connected to one connection member 75. In an example, the two via wirings V1 are arranged next to each other in the x-axis direction.

As illustrated in FIG. 1, in an example, the wiring pattern 61 partially overlaps the wiring pattern 25 in plan view. In an example, the wiring pattern 61 overlaps an upper portion of the wiring pattern 25 illustrated in FIG. 1 in plan view. As illustrated in FIG. 3, in an example, one or more via wirings V2 extend through the upper substrate 40 in the thickness-wise direction and electrically connect the wiring pattern 61 to the connection member 75 disposed on the wiring pattern 25. In the example illustrated in FIG. 1, the wiring pattern 61 is electrically connected to two connection members 75 disposed on the wiring pattern 25 by four via wirings V2. In an example, the four via wirings V2 are arranged next to each other in the x-axis direction. In an example, each of the two connection members 75 is respectively connected to two of the four via wirings V2. As illustrated in FIG. 3, in an example, each via wiring V2 is formed in an opening 43 that exposes a portion of the upper surface of the connection member 75 disposed on the wiring pattern 25. In an example, each via wiring V2 fills the opening 43. In an example, the wiring pattern 61 is formed integrally with the via wirings V2. The wiring pattern 61 is electrically connected to the wiring pattern 25 by the via wirings V2, the connection members 75, and the bonding portion 72. Thus, the wiring pattern 22 is electrically connected to the electrode 31 of the semiconductor element 30 by the bonding portion 72, the connection member 75, the via wirings V1, the wiring pattern 61, the via wirings V2, the connection members 75, the bonding portion 72, the wiring pattern 25, and the bonding portion 71. That is, the wiring pattern 22 including the current input terminal 22A is electrically connected to the electrode 31, which serves as the drain electrode, by a wiring path that includes the wiring patterns 61 and 25.

Structure of Wiring Pattern 62

As illustrated in FIG. 1, in an example, the wiring pattern 62 electrically connects the wiring pattern 23 to the electrodes 32 of the semiconductor element 30. In an example, the wiring pattern 62 electrically connects the current output terminal 23A of the wiring pattern 23 to the electrodes 32 of the semiconductor element 30. In an example, the wiring pattern 62 extends in the x-axis direction in plan view. In an example, the wiring pattern 62 extends in the x-axis direction, that is, a direction from the electrodes 32 toward the current output terminal 23A in plan view.

In an example, the wiring pattern 62 partially overlaps the wiring pattern 23 in plan view. In an example, the wiring pattern 62 overlaps a right end portion of the wiring pattern 23 illustrated in FIG. 1 in plan view. As illustrated in FIG. 4, in an example, one or more (for example, two) via wirings V3 extend through the upper substrate 40 in the thickness-wise direction and electrically connect the wiring pattern 62 to the connection member 75 disposed on the wiring pattern 23. The wiring pattern 62 is electrically connected to the wiring pattern 23 by, for example, the via wirings V3, the connection member 75, and the bonding portion 72. In an example, the wiring pattern 62 is formed integrally with the via wirings V3. In an example, each via wiring V3 is formed in an opening 43 that exposes a portion of the upper surface of the connection member 75 disposed on the wiring pattern 23. In an example, each via wiring V3 fills the opening 43. In an example, two via wirings V3 are connected to one connection member 75. In an example, the two via wirings V3 are arranged next to each other in the x-axis direction.

As illustrated in FIG. 1, in an example, the wiring pattern 62 partially overlaps the semiconductor element 30 in plan view. In an example, the wiring pattern 62 overlaps the electrodes 32 of the semiconductor element 30 in plan view. In an example, the wiring pattern 62 overlaps two electrodes 32 in plan view. As illustrated in FIG. 4, in an example, multiple via wirings 80 extend through the upper substrate 40 in the thickness-wise direction and electrically connect the wiring pattern 62 to the electrodes 32. Thus, the wiring pattern 62 is electrically connected to the electrodes 32 by the via wirings 80 and is electrically connected to the wiring pattern 23 by the via wirings V3, the connection member 75, and the bonding portion 72. In other words, the wiring pattern 23 including the current output terminal 23A is electrically connected to the electrodes 32, which serve as the source electrodes, by the bonding portion 72, the connection member 75, the via wirings V3, the wiring pattern 62, and the via wirings 80. In an example, the wiring pattern 62 is formed integrally with the via wirings 80. In the example illustrated in FIG. 2, the wiring pattern 62 is electrically connected to the two electrodes 32 by twenty via wirings 80.

Structure of Via Wiring 80

As illustrated in FIG. 3, each via wiring 80 extends through the upper substrate 40 in the thickness-wise direction and is connected to the electrode 32. In an example, the via wiring 80 is formed in an opening 43 that exposes a portion of the upper surface of the electrode 32. In an example, the via wiring 80 fills the opening 43. As illustrated in FIG. 2, in an example, each of the electrodes 32 is connected to two or more of the via wirings 80. In the example illustrated in FIG. 2, each of the two electrodes 32 is connected to ten of the twenty via wirings 80. In an example, the twenty via wirings 80 are arranged next to each other in the x-axis direction and the y-axis direction.

As illustrated in FIG. 1, in an example, the via wirings 80 are arranged in six rows in the x-axis direction. The via wirings 80 include one or more (for example, four) via wirings 81 located closest to the current output terminal 23A in the x-axis direction. In an example, the contour of the semiconductor element 30 that is rectangular in plan view is defined by four sides, and the four via wirings 81 are arranged next to each other along one of the four sides located closest to the current output terminal 23A in the x-axis direction. In the example illustrated in FIG. 1, the four via wirings 81 are arranged along the left one of the four sides extending in the y-axis direction.

The four via wirings 81 are spaced apart from each other in the y-axis direction. In the following description, for the sake of convenience, the four via wirings 81 may be referred to as first-row via wirings 81 or via wirings 81 in the first row. The via wirings 80 include one or more second-row via wirings 82 located adjacent to the first-row via wirings 81 in the x-axis direction and one or more third-row via wirings 83 located adjacent to the second-row via wirings 82 in the x-axis direction. In addition, the via wirings 80 include one or more fourth-row via wirings 84 located adjacent to the third-row via wirings 83 in the x-axis direction and one or more fifth-row via wirings 85 located adjacent to the fourth-row via wirings 84 in the x-axis direction. In addition, the via wirings 80 include one or more sixth-row via wirings 86 located adjacent to the fifth-row via wirings 85 in the x-axis direction. In the example illustrated in FIG. 1, the via wirings 80 includes three via wirings 82, three via wirings 83, three via wirings 84, three via wirings 85, and four via wirings 86.

As illustrated in FIG. 2, in an example, the via wirings 81, 82, and 83 in the first to third rows are connected to one of the electrodes 32, and the via wirings 84, 85, and 86 in the fourth to sixth rows are connected to the other electrode 32. In an example, the via wirings 81, 82, and 83 in the first to third rows are disposed in a staggered arrangement on the upper surface of the electrode 32. In an example, the first-row via wirings 81 and the third-row via wirings 83 are disposed to overlap each other in the x-axis direction. In an example, the second-row via wirings 82 are disposed at positions different from the first-row via wirings 81 and the third-row via wirings 83 in the y-axis direction. In an example, the via wirings 84, 85, and 86 in the fourth to sixth rows are disposed in a staggered arrangement on the upper surface of the electrode 32. In an example, the fourth-row via wirings 84 and the sixth-row via wirings 86 are disposed to overlap each other in the x-axis direction. In an example, the fifth-row via wirings 85 are disposed at positions different from the fourth-row via wirings 84 and the sixth-row via wirings 86 in the y-axis direction. In an example, the third-row via wirings 83 and the fourth-row via wirings 84 are disposed to overlap each other in the x-axis direction.

Each of the via wirings 81 to 86 may have any planar shape and any size in plan view. The via wirings 81 to 86 may have the same planar shape or different planar shapes. In the example illustrated in FIG. 1, the via wirings 81 to 86 have the same circular shape.

The first-row via wirings 81 are greater than the second-row via wirings 82 in size in plan view. In an example, each of the via wirings 81 is greater than each of the via wirings 80 other than the via wirings 81, namely, the via wirings 82 to 86 in the second to sixth rows, in size in plan view. In an example, the via diameter (or, diameter) of the first-row via wiring 81 is greater than that of the second-row via wiring 82. In an example, the via diameter of each via wiring 81 is greater than that of the via wirings 82 to 86 in the second to sixth rows. In an example, the four via wirings 81 have the same planar shape and the same size in plan view. In an example, the via wirings 82 to 86 in the second to sixth rows have the same planar shape and the same size in plan view. In other words, among all of the via wirings 81 to 86, provided as the via wirings 80, only the first-row via wirings 81 are greater than the other via wirings 80 in size in plan view. The size of each via wiring 81 in plan view may be set to, for example, a range from 1.2 times to 2 times the size of the other via wirings 82 to 86 in plan view. In an example, the via diameter of each of the via wirings 82 to 86 may be in a range from 300 μm to 600 μm, and the via diameter of each via wiring 81 may be in a range from 360 μm to 1200 μm.

Structure of Wiring Pattern 63

As illustrated in FIG. 1, in an example, the wiring pattern 63 electrically connects the wiring pattern 24 to the electrode 33 of the semiconductor element 30. In an example, the wiring pattern 63 extends in the x-axis direction in plan view. In an example, the wiring pattern 63 extends from the wiring pattern 24 to the semiconductor element 30 in plan view.

In an example, the wiring pattern 63 partially overlaps the wiring pattern 24 in plan view. In an example, the wiring pattern 63 overlaps a right end portion of the wiring pattern 24 illustrated in FIG. 1 in plan view. In an example, one or more via wirings V4 extend through the upper substrate 40 in the thickness-wise direction and electrically connect the wiring pattern 63 to the connection member 75 disposed on the wiring pattern 24. In the example illustrated in FIG. 1, the wiring pattern 63 is electrically connected to two connection members 75 disposed on the wiring pattern 24 by four via wirings V4. Although not illustrated in detail, the wiring pattern 63 is electrically connected to the wiring pattern 24 via, for example, the via wirings V4 and the connection members 75. In an example, the wiring pattern 63 is formed integrally with the via wirings V4. In an example, each of the two connection members 75 is connected to two of the four via wirings V4. In an example, the four via wirings V4 are arranged next to each other in the x-axis direction.

In an example, the wiring pattern 63 partially overlaps the semiconductor element 30 in plan view. In an example, the wiring pattern 63 overlaps the electrode 33 of the semiconductor element 30 in plan view. As illustrated in FIGS. 2 and 4, in an example, one or more (for example, one) via wirings V5 extend through the upper substrate 40 in the thickness-wise direction and electrically connect the wiring pattern 63 to the electrodes 33. In an example, the wiring pattern 63 is formed integrally with the via wiring V5. In an example, the via wiring V5 is formed in an opening 43 that exposes a portion of the upper surface of the electrode 33. In an example, the via wiring V5 fills the opening 43.

As illustrated in FIG. 1, the wiring pattern 63 is electrically connected to the electrode 33 by the via wiring V5 and is electrically connected to the wiring pattern 24 by the via wirings V4 and the connection members 75. In other words, the electrode 33 serving as the gate electrode is electrically connected to the wiring pattern 24 by the via wiring V5, the wiring pattern 63, the via wirings V4, and the connection members 75.

Structure of Encapsulation Resin 50

As illustrated in FIG. 3, the encapsulation resin 50, for example, encapsulates the semiconductor element 30, the connection members 75, and the bonding portions 71 and 72 disposed between the lower substrate 20 and the upper substrate 40. For example, the encapsulation resin 50 covers the side surfaces of the semiconductor element 30, the side surfaces of each connection member 75, the upper surface of the bonding portion 71 exposed from the semiconductor element 30, the side surfaces of the bonding portion 71, the upper surfaces of the bonding portions 72 exposed from the connection members 75, and the side surfaces of each bonding portion 72. In an example, the encapsulation resin 50 covers the entire lower surface of the upper substrate 40. In an example, the encapsulation resin 50 covers the upper surface of the wiring layer 21 exposed from the bonding portions 71 and 72, the side surfaces of the wiring layer 21, and the upper surface of the lower substrate 20 exposed from the wiring layer 21 in a region overlapping the upper substrate 40 in plan view.

The material of the encapsulation resin 50 may be, for example, a non-photosensitive insulative resin containing a thermosetting resin as a main component. The material of the encapsulation resin 50 may be, for example, an insulative resin, such as epoxy resin or polyimide resin, or a resin material obtained by mixing the resin with a filler such as silica and alumina. The encapsulation resin 50 may be, for example, a mold resin.

As illustrated in FIGS. 1 and 3, the wiring path of the electrode 31 is extended to the outside of the encapsulation resin 50 by the wiring patterns 25, 61, and 22. As illustrated in FIG. 1, the wiring path of the electrode 32 is extended to the outside of the encapsulation resin 50 by the wiring patterns 62 and 23. The wiring path of the electrode 33 is extended to the outside of the encapsulation resin 50 by the wiring patterns 63 and 24.

Current Path

The path of the current I1 flowing through the semiconductor device 10 when the semiconductor element 30 is driven will now be described with reference to FIGS. 3 to 5.

Figure 5:
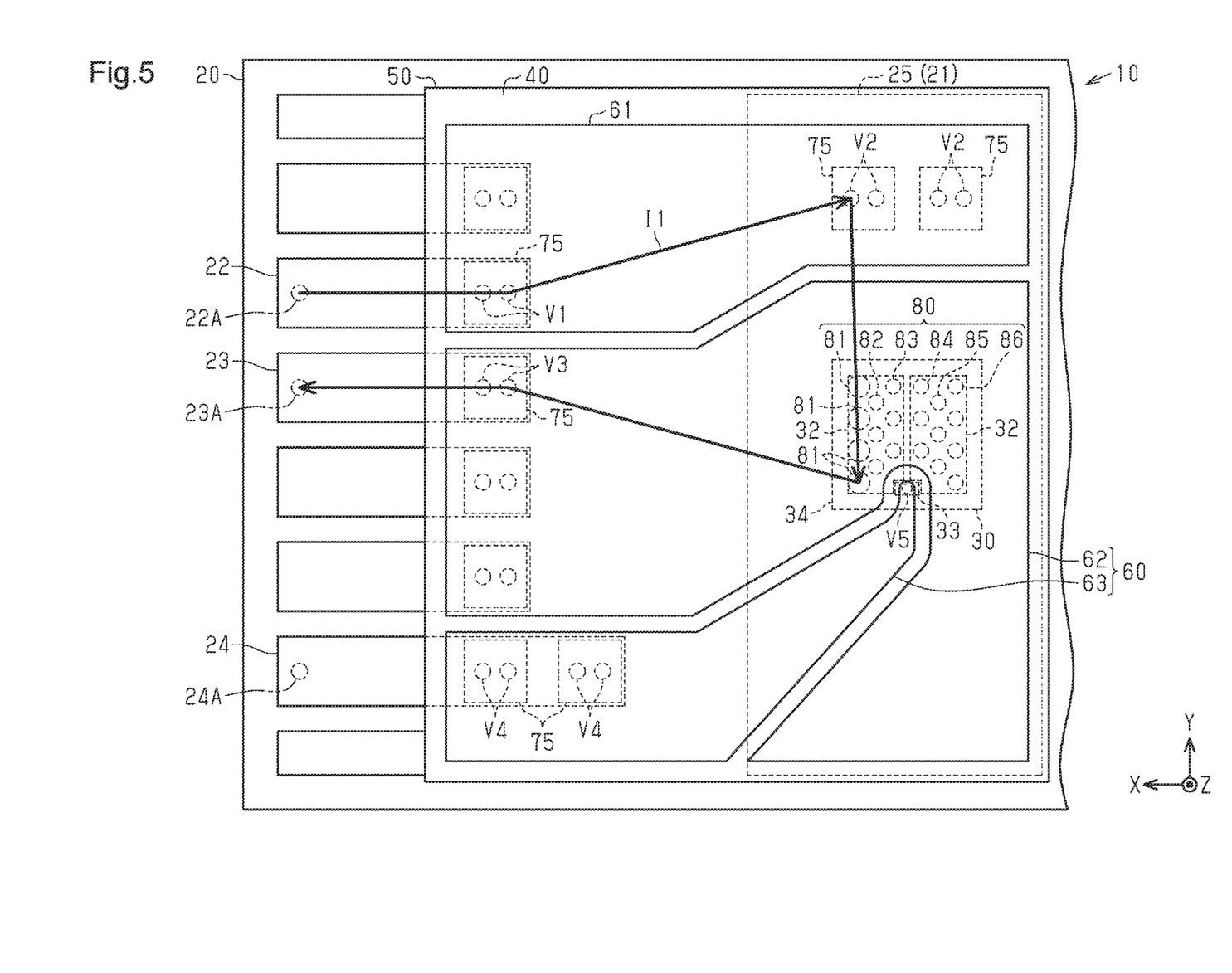
FIG. 5 is a schematic plan view illustrating a current path of the semiconductor device of FIG. 1.

As illustrated in FIGS. 3 and 5, when the current I1 is input to the current input terminal 22A, the current I1 flows from the wiring pattern 22 to the wiring pattern 61 through the connection members 75 and the via wirings V1. Subsequently, the current I1 flows through the wiring pattern 61 from the via wirings V1 toward the via wirings V2. The current I1 flows from the wiring pattern 61 to the wiring pattern 25 through the via wirings V2 and the connection members 75. As illustrated in FIG. 3, the current I1 flows from the wiring pattern 25 to the electrode 31 through the bonding portion 71. The current I1 flows from the electrodes 32 to the wiring pattern 62 through the via wirings 80. As illustrated in FIGS. 4 and 5, the current I1 flows in the wiring pattern 62 from the via wirings 80 toward the via wirings V3. The current I1 flows from the wiring pattern 62 to the wiring pattern 23 through the via wirings V3 and the connection members 75. The current I1 is output from the current output terminal 23A of the wiring pattern 23.

The study of the inventor of the present invention has found that among the multiple via wirings 80 connected to the electrodes 32 serving as the source electrodes, the current density is likely to increase in those via wirings located at the exit side of the current I1. In the example illustrated in FIG. 1, the current density is likely to increase in the first-row via wirings 81. That is, of the multiple via wirings 80, the current density is likely to increase in the first-row via wirings 81, which are located closest to the current output terminal 23A in the x-axis direction.

In this regard, in the semiconductor device 10, the first-row via wirings 81, which are disposed where the current density is likely to increase (where the current is likely to concentrate) are set to be greater than the other via wirings 82 to 86 in size in plan view. Thus, the volume of the via wirings 81 is increased as compared to a structure in which the via wirings 81 are the same in size in plan view as the via wirings 82 to 86. This allows for dispersion of the current density in the via wirings 81 and appropriately limits increases in the current density in the via wirings 81.

In the present embodiment, the electrode 31 is an example of a first electrode. The electrode 32 is an example of a second electrode. The electrode 33 is an example of a third electrode. The wiring pattern 22 is an example of a first wiring pattern. The wiring pattern 62 is an example of a second wiring pattern. The x-axis direction is an example of a first direction. The y-axis direction is an example of a second direction. In addition, the via wiring 81 is an example of a first via wiring. The via wiring 82 is an example of a second via wiring. The via wiring 83 is an example of a third via wiring.

Simulation

Figure 6:
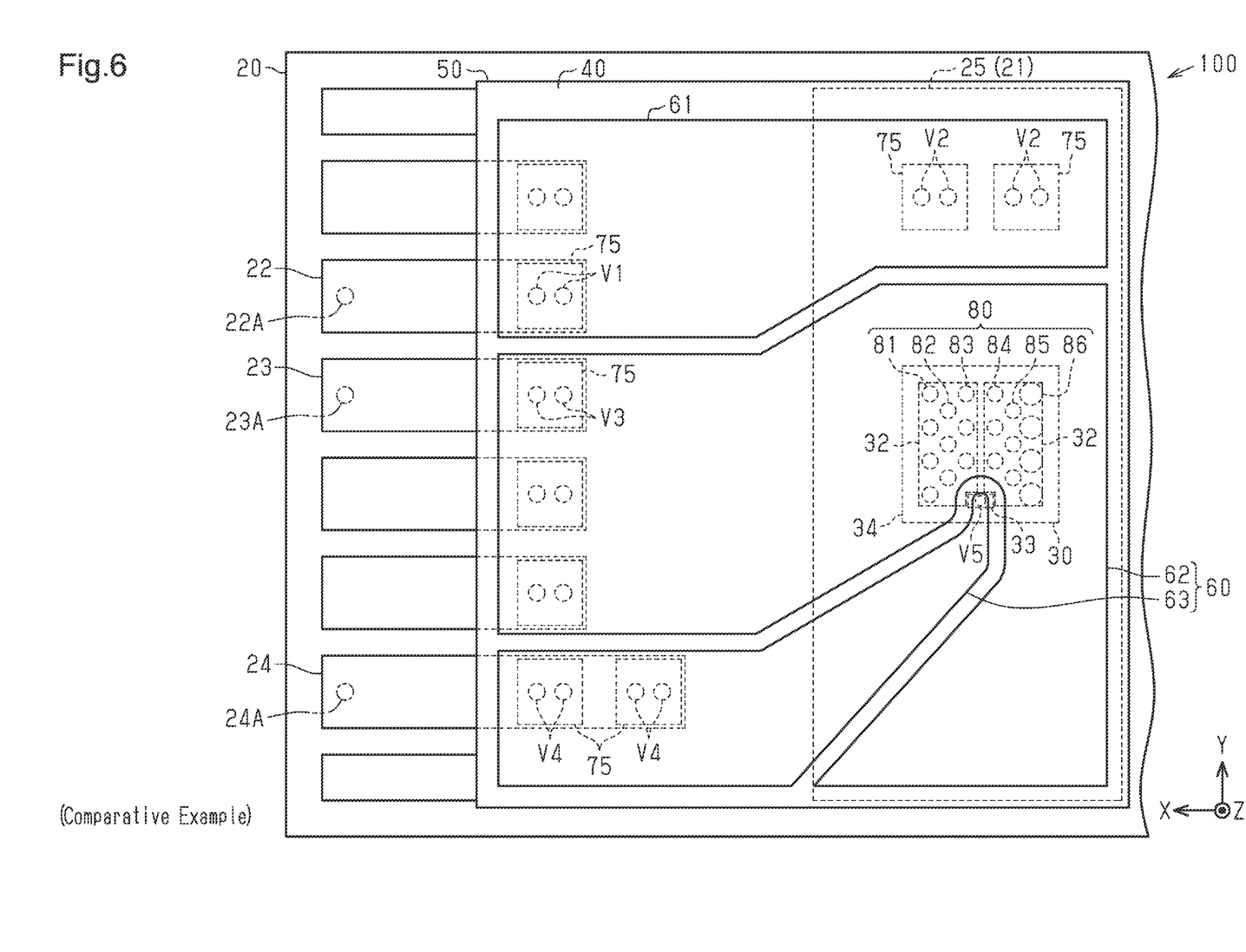
FIG. 6 is a schematic plan view illustrating a comparative example of a semiconductor device.

Simulation analysis of current density was performed on the semiconductor device 10 (sample 1) illustrated in FIGS. 1 to 4 and a comparative example of a semiconductor device 100 (sample 2) illustrated in FIG. 6.

Simulation Condition

In the semiconductor device 10 of sample 1, the via diameters of the via wirings 82 to 86 in the second to sixth rows were set to 500 µm. In the semiconductor device 10 of sample 1, simulation of current density distribution was performed as the via diameters of each first-row via wirings 81 were changed to 300 µm, 500 µm, 650 µm, and 700 µm. In comparative example 1, the via diameter of each of the four via wirings 81 was set to 300 µm, which is smaller than the via diameters of the via wirings 82 to 86. In comparative example 2, the via diameter of each of the four via wirings 81 was set to 500 µm, which is the same as the via diameters of the via wirings 82 to 86. In example 1, the via diameter of each of the four via wirings 81 was set to 650 µm, which is larger than the via diameters of the via wirings 82 to 86. In example 2, the via diameter of each of the four via wirings 81 was set to 700 µm, which is larger than the via diameters of the via wirings 82 to 86. In the simulation, the specified maximum current (i.e., 95 A in this example) was input to the current input terminal 22A of the semiconductor device 10 to measure the maximum current density in the multiple via wirings 80 in comparative examples 1 and 2 and examples 1 and 2. Then, the rate of change in the maximum current density was calculated for each of comparative example 1 and examples 1 and 2 with respect to the maximum current density in comparative example 2, in which the via diameter of each via wiring 81 was set to 500 µm. In this example, the rate of change in the maximum current density in comparative example 2 was set to 0%, and the rate of change in the maximum current density in each of comparative example 1 and examples 1 and 2 was calculated as the maximum current density change rate.

In the semiconductor device 100 of sample 2, the via diameters of the via wirings 81 to 85 in the first to fifth rows were set to 500 µm. In the semiconductor device 100 of sample 2, as the via diameter of each sixth-row via wiring 86 was changed to 300 µm, 500 µm, 650 µm, and 700 µm, simulation of current density distribution was performed. That is, in the semiconductor device 100 of sample 2, the via diameter of the via wiring 86, which is located farthest from the current output terminal 23A in the x-axis direction, was varied. In comparative example 3, the via diameter of each of the four via wirings 86 was set to 300 µm. In comparative example 4, the via diameter of each of the four via wirings 86 was set to 500 µm. In comparative example 5, the via diameter of each of the four via wirings 86 was set to 650 µm. In comparative example 6, the via diameter of each of the four via wirings 86 was set to 700 µm. Simulation was performed on the semiconductor devices 100 of comparative examples 3 to 6 under the same condition as the semiconductor device 10 of sample 1. In the semiconductor devices 100 of comparative examples 3 to 6, the rate of change in the maximum current density in comparative example 4 was set to 0%, and the rate of change in the maximum current density in each of comparative examples 3, 5, and 6 was calculated as the maximum current density change rate.

Simulation Result

Figure 7:
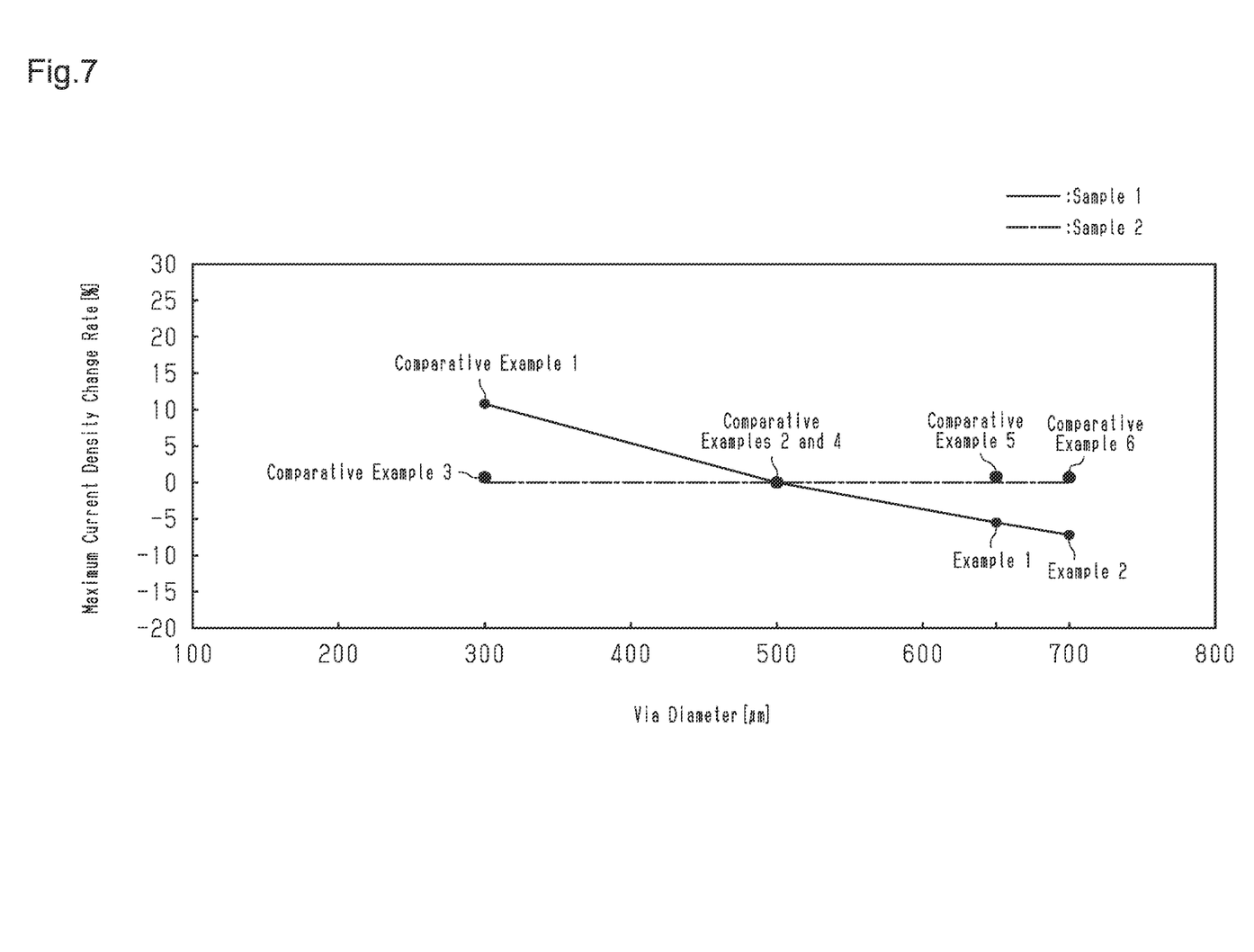
FIG. 7 is a graph illustrating simulation results of the current density.

The simulation results of the current density change rate are illustrated in FIG. 7. The horizontal axis illustrated in FIG. 7 indicates the via diameter of the via wiring 81 for sample 1 and the via diameter of the via wiring 82 for sample 2. The vertical axis illustrated in FIG. 7 indicates the maximum current density change rate. In FIG. 7, the solid line indicates the maximum current density change rate of sample 1, and the single-dashed line indicates the maximum current density change rate of sample 2. Although not illustrated, in all of comparative examples 1 to 6 and examples 1 and 2, some of the first-row via wirings 81 had the maximum current density.

As illustrated in FIG. 7, in the semiconductor device 10 of sample 1, the maximum current density was decreased in inverse proportion to the via diameter of the via wiring 81. Thus, it was conformed that when the via diameter of the via wiring 81 is set to be larger than the via diameters of the other via wirings 82 to 86 (examples 1 and 2), the maximum current density becomes lower than that in comparative example 2 in which the via diameter of the via wiring 81 is set to be the same as the via diameters of the via wirings 82 to 86. That is, it was confirmed that when the via diameter of the via wiring 81 is set to be larger than the via diameters of the other via wirings 82 to 86, the current density in the via wiring 81 is more dispersed than that in comparative example 2, thereby limiting increases in the current density in the via wiring 81. Further, it is clear from the results of examples 1 and 2 that as the via diameter of the via wiring 81 becomes larger, the maximum current density decreases further.

In contrast, in the semiconductor device 100 of sample 2, it was confirmed that changes in the maximum current density were minimal even when the via diameter of the via wiring 86 was changed. That is, it was confirmed that there is no correlation between the via diameter of the via wiring 86 and the maximum current density, that is, the current density in the via wiring 81. In other words, it was confirmed that even when the via diameter of the via wiring 86 is set to be larger than the via diameters of the other via wirings 81 to 85, the maximum current density in the via wirings 80 does not decrease. That is, it was confirmed that even when the total volume of the via wirings 80 is increased by increasing the via diameter of the via wiring 86, the maximum current density in the via wirings 80 does not decrease.

From the results, the current density in the via wiring 81 is dispersed by increasing the via diameter of the via wiring 81, which is located at the exit side of the current I1 where the current density is likely to increase, among the via wirings 80. This limits increases in the current density in the via wiring 81, thereby appropriately limiting local breakage of the via wiring 81.

The present embodiment has the following advantages.

(1) The multiple via wirings 80, which connect the electrodes 32 of the semiconductor element 30 to the wiring pattern 62, include one or more via wirings 81 located closest to the current output terminal 23A in the x-axis direction and via wirings 82 located adjacent to the via wirings 81. The via wirings 81 are greater than the via wirings 82 in size in plan view.

In this structure, the via wirings 81, which are located at the exit side of the current I1 where the current density is likely to increase (i.e., where the current is likely to concentrate) among the via wirings 80, are greater than the via wirings 82 in size in plan view. Thus, the current density in the via wirings 81 is dispersed as compared with a structure in which the via wirings 81 and the via wirings 82 are the same in size in plan view. Thus, increases in the current density in the via wirings 81 are limited. This appropriately limits local heat generation in the via wirings 81 caused by an increase in current density, thereby appropriately limiting local breakage of the via wirings 81. Thus, the reliability of electrical connection between the electrode 32 of the semiconductor element 30 and the wiring pattern 62 is less likely to be decreased.

(2) The planar shape of the semiconductor element 30 is rectangular. The via wirings 80 include multiple (four in the example illustrated in FIG. 1) via wirings 81 arranged next to each other along the side of the semiconductor element 30 located closest, of the four sides, to the current output terminal 23A in the x-axis direction. Each of the four via wirings 81 is greater than the via wirings 82 in size in plan view.

In this structure, all of the via wirings 81, located where the current density is likely to increase, are greater than the via wirings 82 in size in plan view. As a result, the current density in all of the via wirings 81 is dispersed, and thus increases in the current density in all of the via wirings 81 are limited.

(3) If the via wirings 82 to 86 in the second to sixth rows are also increased in size in plan view together with the via wirings 81 in the first row, the area of adhesion between the adhesive layer 42 of the upper substrate 40 and the electrode 32 is decreased. Therefore, when all of the via wirings 80 are equally increased in size in plan view, the upper substrate 40 is more likely to be separated from the semiconductor element 30. In this regard, in the semiconductor device 10, the via wirings 81 in the first row are greater than the via wirings 80 other than the via wirings 81, namely, the via wirings 81 in the second to sixth rows, in size in plan view. In this structure, only the via wirings 81 in the first row have a large planar size among the via wirings 80. This avoids a decrease in the area of adhesion between the adhesive layer 42 of the upper substrate 40 and the electrode 32, thereby appropriately limiting separation of the upper substrate 40 from the semiconductor element 30. Therefore, while limiting increases in the current density in the first-row via wirings 81, separation of the upper substrate 40 is appropriately limited.

OTHER EMBODIMENTS

It should be apparent to those skilled in the art that the foregoing embodiments may be implemented in many other specific forms without departing from the scope of this disclosure. Particularly, it should be understood that the foregoing embodiments may be implemented in the following forms.

The embodiment described above may be modified as follows. The embodiment and the following modified examples may be combined within a scope in which the combined modified examples remain technically consistent with each other.

Figure 8:
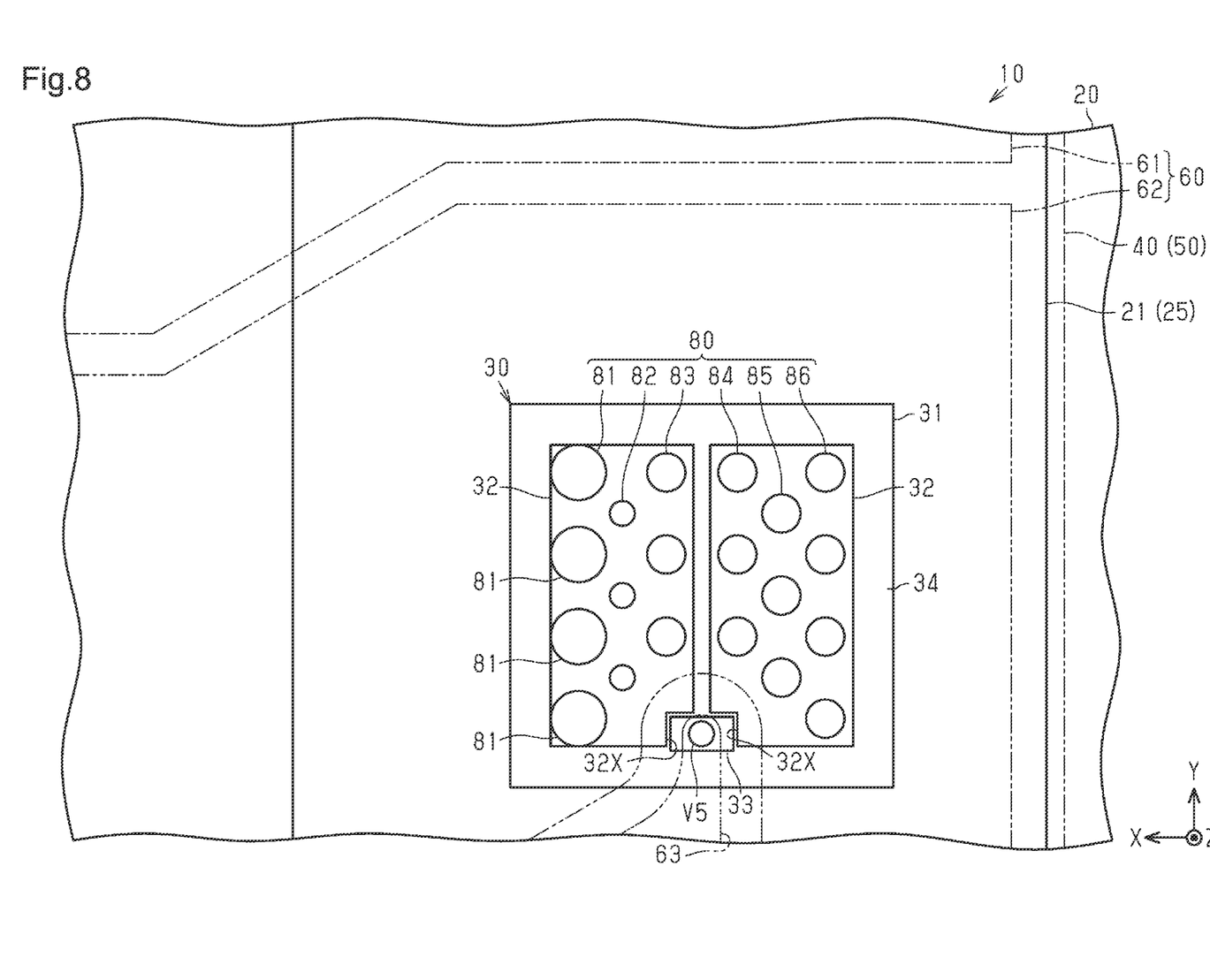
FIG. 8 is an enlarged partial plan view illustrating a modified example of a semiconductor device.

As illustrated in FIG. 8, the second-row via wirings 82 may be smaller than the third-row via wirings 83 in size in plan view. In the example illustrated in FIG. 8, each of the via wirings 82 is smaller than each of the via wirings 83 to 86 in the third to sixth rows in size in plan view.

In this structure, the via wirings 82, which are located adjacent to the via wirings 81 that are greater than the via wirings 82 to 86 in size in plan view, are smaller than the via wirings 83 to 86 in size in plan view. This allows for enlargement of the region for increasing the size of the via wiring 81 in plan view. Moreover, while increasing the size of the via wiring 81 in plan view, decreases in the area of adhesion between the adhesive layer 42 of the upper substrate 40 and the electrode 32 are limited.

The number and arrangement of the via wirings 80 in the embodiment may be appropriately changed. For example, the number of via wirings 81 located closest to the current output terminal 23A in the x-axis direction may be one to three or may be five or more. In the embodiment, the multiple via wirings 80 are arranged in, for example, six rows in the x-axis direction. Instead, the multiple via wirings 80 may be arranged in two to five rows or seven or more rows in the x-axis direction.

In the embodiment, the current input terminal 22A is disposed on the upper surface of the lower substrate 20. Instead, the current input terminal 22A may be disposed, for example, on the upper surface of the upper substrate 40. Alternatively, the wiring pattern 61, which is disposed on the upper surface of the upper substrate 40, may include the current input terminal 22A.

In the embodiment, the current output terminal 23A is disposed on the upper surface of the lower substrate 20. Instead, the current output terminal 23A may be disposed, for example, on the upper surface of the upper substrate 40. Alternatively, the wiring pattern 62, which is disposed on the upper surface of the upper substrate 40, may include the current output terminal 23A.

In the embodiment, the connection terminal 24A is disposed on the upper surface of the lower substrate 20. Instead, the connection terminal 24A may be disposed, for example, on the upper surface of the upper substrate 40. Alternatively, the wiring pattern 63, which is disposed on the upper surface of the upper substrate 40, may include the connection terminal 24A.

In the embodiment, the range in which the encapsulation resin 50 is formed may be appropriately changed. In an example, the encapsulation resin 50 may cover the side surfaces of the upper substrate 40. In example, the encapsulation resin 50 may cover the upper surface of the upper substrate 40. In an example, the encapsulation resin 50 may partially cover the upper surface of the wiring layer 60.

In the embodiment, the encapsulation resin 50 may be omitted.

In the embodiment, the upper substrate 40 is smaller than the lower substrate 20 in size in plan view. Instead, for example, the upper substrate 40 may be greater than or equal to the lower substrate 20 in size in plan view.

In the embodiment, a metal plate may be disposed on the lower surface of the lower substrate 20 and used as a heat dissipation plate.

In the embodiment, the substrate body 41 of the upper substrate 40 has a single-layer structure but is not limited to such a structure. For example, the substrate body 41 may have a stacked structure in which one or more wiring layers and multiple insulation layers are stacked.

In the embodiment, the semiconductor element 30 is embodied as a MOSFET.

Figure 9:
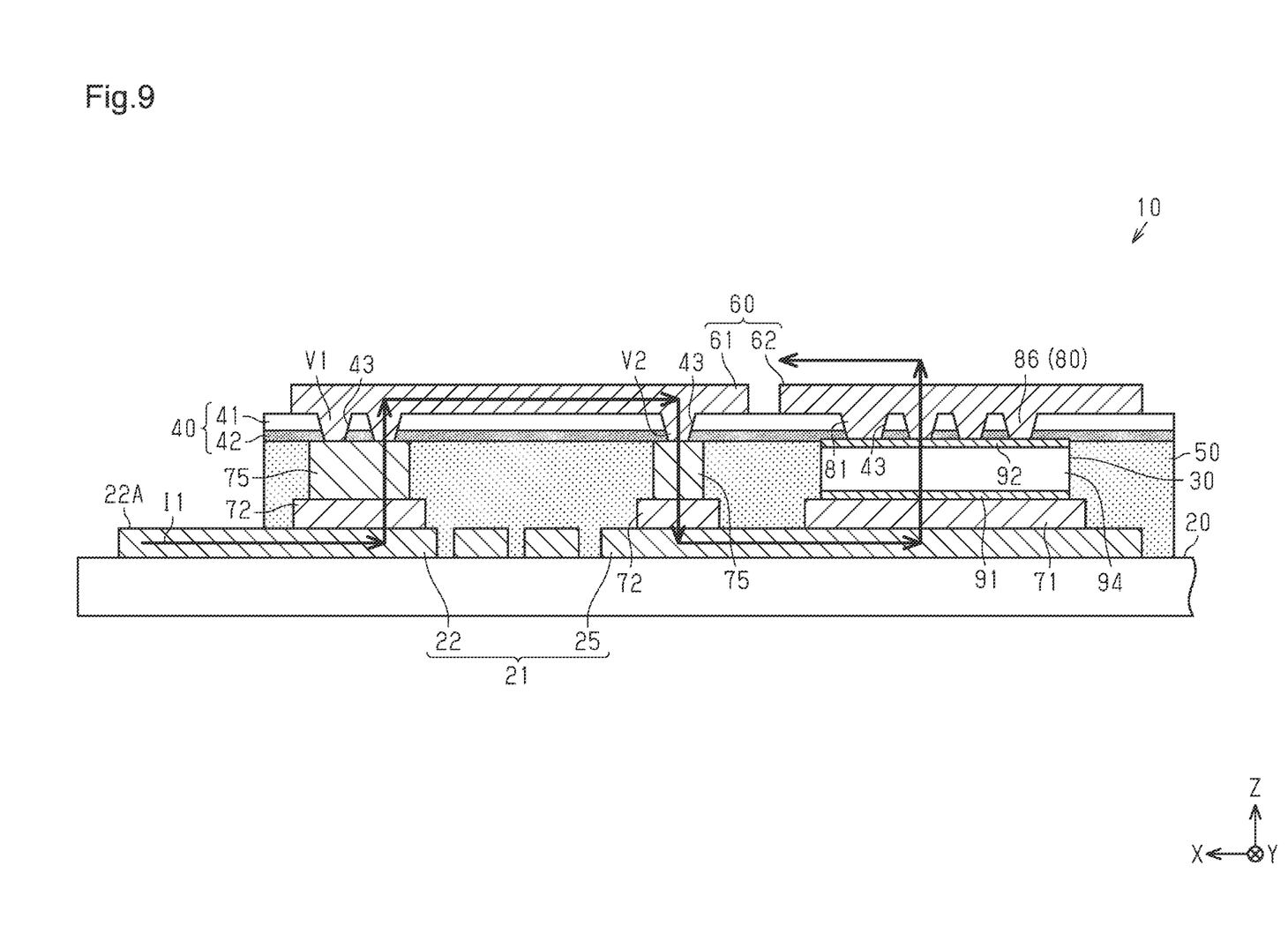
FIG. 9 is a schematic cross-sectional view illustrating another modified example of a semiconductor device.

Instead, for example, as illustrated in FIG. 9, the semiconductor element 30 may be embodied as a diode that includes an electrode 91 as an anode electrode and an electrode 92 as a cathode electrode. The diode may be a power semiconductor element. The semiconductor element 30 includes, for example, a main body 94. The electrode 91 is disposed on, for example, the lower surface of the main body 94. The electrode 91 covers, for example, the entire lower surface of the main body 94. The electrode 92 is disposed on, for example, the upper surface of the main body 94. The electrode 92 covers, for example, the entire upper surface of the main body 94. In this structure, the wiring pattern 62 is electrically connected to the electrode 92 by the multiple via wirings 80, which extend through the upper substrate 40 in the thickness-wise direction. Even in this case, the via wirings 81, which are located at the exit side of the current I1 among the plurality of via wirings 80, are greater than the via wirings 80 other than the via wirings 81 in size in plan view.

In the embodiment, the semiconductor device 10 is embodied in a power semiconductor device. Alternatively, for example, the semiconductor device 10 may be embodied in various types of semiconductor devices other than a power semiconductor device.

In the embodiment, the semiconductor element 30 is embodied in a power semiconductor element. Alternatively, for example, the semiconductor element 30 may be embodied in a semiconductor element other than a power semiconductor element.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:

1. A semiconductor device, comprising:
   a lower substrate;
   a first wiring pattern disposed on an upper surface of the lower substrate and including a current input terminal to which a current is input;
   a semiconductor element mounted on the upper surface of the lower substrate and including a first electrode electrically connected to the first wiring pattern and a second electrode, the first electrode and the second electrode being disposed at opposite sides of the semiconductor element;
   an upper substrate disposed on the second electrode of the semiconductor element;
   multiple via wirings extending through the upper substrate in a thickness-wise direction and connected to the second electrode;
   a second wiring pattern disposed on an upper surface of the upper substrate and electrically connected to the second electrode via the multiple via wirings; and
   a current output terminal that outputs the current, wherein
   the second wiring pattern is electrically connected to the current output terminal and extends in a first direction from the second electrode toward the current output terminal in plan view,
   the multiple via wirings include
      one or more first via wirings disposed closest to the current output terminal in the first direction, and
      one or more second via wirings disposed adjacent to the one or more first via wirings in the first direction, and
   each of the one or more first via wirings is greater than each of the one or more second via wirings in size in plan view.

2. The semiconductor device according to claim 1, wherein
   the semiconductor element has a rectangular planar shape,
   the multiple via wirings include multiple first via wirings as the one or more first via wirings, and
   the multiple first via wirings are arranged adjacent to each other along a side of the semiconductor element located closest, of four sides of the semiconductor element, to the current output terminal in the first direction.

3. The semiconductor device according to claim 1, wherein each of the one or more first via wirings is greater than each of ones of the multiple via wirings other than the one or more first via wirings in size in plan view.

4. The semiconductor device according to claim 1, wherein the one or more first via wirings are displaced from the one or more second via wirings in a second direction that is orthogonal to the first direction in plan view.

5. The semiconductor device according to claim 1, wherein
   the multiple via wirings further include one or more third via wirings disposed adjacent to the one or more second via wirings in the first direction,
   each of the one or more first via wirings is greater than each of the one or more third via wirings in size in plan view, and
   each of the one or more second via wirings is smaller than each of the one or more third via wirings in size in plan view.

6. The semiconductor device according to claim 5, wherein
   the one or more first via wirings are displaced from the one or more second via wirings in a second direction that is orthogonal to the first direction in plan view, and
   the one or more second via wirings are displaced from the one or more third via wirings in the second direction.

7. The semiconductor device according to claim 1, further comprising:
   an encapsulation resin disposed between the lower substrate and the upper substrate and encapsulating the semiconductor element, wherein
   the current input terminal is disposed on a position exposed from the encapsulation resin, and
   the current output terminal is disposed on a position exposed from the encapsulation resin.

8. The semiconductor device according to claim 1, wherein the semiconductor element includes a power semiconductor element.

9. The semiconductor device according to claim 8, wherein the semiconductor element includes a metal-oxide-semiconductor field-effect transistor, the metal-oxide-semiconductor field-effect transistor including the first electrode as a drain electrode, the second electrode as a source electrode, and a third electrode as a gate electrode.

10. The semiconductor device according to claim 8, wherein the semiconductor element includes a diode, the diode including the first electrode as an anode electrode and the second electrode as a cathode electrode.

* * * * *